(12) United States Patent
Jeng et al.

(10) Patent No.: US 10,672,464 B2
(45) Date of Patent: Jun. 2, 2020

(54) METHOD OF PERFORMING FEEDFORWARD AND RECURRENT OPERATIONS IN AN ARTIFICIAL NEURAL NETWORK USING NONVOLATILE MEMORY CELLS

(71) Applicant: Chung Yuan Christian University, Taoyuan (TW)

(72) Inventors: Syang-Ywan Jeng, Taipei (TW); Shang-Wei Chou, Taoyuan (TW)

(73) Assignee: Chung Yuan Christian University (TW)

( * ) Notice: Subject to any disclaimer, the term of this patent is extended or adjusted under 35 U.S.C. 154(b) by 0 days.

(21) Appl. No.: 16/243,079

(22) Filed: Jan. 9, 2019

(65) Prior Publication Data

US 2019/0221257 A1    Jul. 18, 2019

(30) Foreign Application Priority Data

Jan. 12, 2018 (TW) ............................. 107101246 A

(51) Int. Cl.
| | |
|---|---|
| *G11C 16/04* | (2006.01) |
| *G11C 11/54* | (2006.01) |
| *G11C 16/08* | (2006.01) |
| *G11C 16/24* | (2006.01) |
| *G06N 3/04* | (2006.01) |
| *G11C 16/14* | (2006.01) |
| *G06N 3/08* | (2006.01) |
| *G11C 16/10* | (2006.01) |

(52) U.S. Cl.
CPC ................ *G11C 11/54* (2013.01); *G06N 3/04* (2013.01); *G06N 3/08* (2013.01); *G11C 16/0466* (2013.01); *G11C 16/08* (2013.01); *G11C 16/10* (2013.01); *G11C 16/14* (2013.01); *G11C 16/24* (2013.01)

(58) Field of Classification Search
CPC ..... G11C 11/54; G11C 16/10; G11C 16/0466; G11C 16/14; G11C 16/24; G11C 16/08; G11C 16/0475; G11C 13/0028; G11C 13/0026; G11C 11/1657; G11C 11/1655; G11C 7/1006; G11C 13/0007; G11C 13/0004; G11C 27/005; G06N 3/08; G06N 3/04; G06N 3/063
USPC ..................................................... 365/185.29
See application file for complete search history.

(56) References Cited

U.S. PATENT DOCUMENTS

| | | | | | |
|---|---|---|---|---|---|
| 4,873,455 | A | * | 10/1989 | de Chambost | ......... B82Y 10/00 706/33 |
| 4,988,891 | A | * | 1/1991 | Mashiko | .............. G06N 3/0675 326/36 |

(Continued)

*Primary Examiner* — Tha-O H Bui

(57) ABSTRACT

A method for achieving a feedforward operation and/or a recurrent operation in an artificial neural network having a self-training learning function. The forgoing artificial neural network (ANN) comprises M×N numbers nonvolatile memory cells that are arranged to form a memory array, and the nonvolatile memory cell can be a non-overlapped implementation (NOI) MOSFET, a RRAM element, a PCM element, a MRAM element, or a SONOS element. By applying this novel method to the ANN, it is able to perform the feedforward and recurrent operations in the M×N numbers of nonvolatile memory cells storing with different bit weights that are formed by injected electrons through the self-training learning function of the ANN.

10 Claims, 10 Drawing Sheets

(56) References Cited

U.S. PATENT DOCUMENTS 5,293,457 A * 3/1994 Arima .................... G06N 3/063
                                                706/34
6,141,241 A * 10/2000 Ovshinsky .............. G11C 11/54
                                                365/163

* cited by examiner

METHOD OF PERFORMING FEEDFORWARD AND RECURRENT OPERATIONS IN AN ARTIFICIAL NEURAL NETWORK USING NONVOLATILE MEMORY CELLS

BACKGROUND OF THE INVENTION

1. Field of the Invention

The present invention relates to the technology field of nonvolatile memory elements or devices, and more particularly to a method of performing feedforward and recurrent operations in an artificial neural network (ANN) using nonvolatile memory cells.

2. Description of the Prior Art

Recently, roles of various non-volatile memories play in semiconductor memory devices have become more and more important. Moreover, with the popularization of portable electronic products such as notebook, digital camera, smart phone, and tablet PC, the non-volatile memories are broadly applied and required to include higher unit-area storage capacity.

When a non-volatile memory device such as flash memory device is operated, it is able to carried out at least one weight-related data store in one or more memory cells of the non-volatile memory device by applying a programming operation and/or an erasing operation to the memory cells. Moreover, data weight verification procedures would be subsequently activated for determining whether each of the weight-related data in the memory cells does meet standards of target weight. The data weight verification procedures can be completed by inspecting current, voltage or threshold voltage of the memory cells been applied with the programing or erasing operation.

FIG. 1 shows a waveform diagram for depicting a data writing signal with periodic constant pulse voltages. When some of the nonvolatile memory cells in the flash memory device are detected to store with "fail data (bits)" during the data verification procedures, the data writing signal with periodic constant pulse voltages as shown in FIG. 1 is adopted for applying at least one data re-writing operation to those nonvolatile memory cells having fail bits, so as to correct the fail bits and then make all of the nonvolatile memory cells in the flash memory device meet the standards of target bits.

Above-describing method for correcting the fail bits of the nonvolatile memory cells can be implemented into the flash memory device by using simple peripheral circuit units. Moreover, when using this method to repair the fail bits in one or more nonvolatile memory cells, the other nonvolatile memory cells would not be influenced by the data writing signal applied to those nonvolatile memory cells having fail bits. It needs to note that, the data writing signal as shown in FIG. 1 fails to effectively adjust or repair the fail bits of the nonvolatile memory cells in the flash memory device in the case of the fact that the flash memory device comprising huge number of nonvolatile memory cells. On the other hand, artificial neural network technology is recently implemented in memory device for use of data management. For instance, making memory cells having different threshold voltages to output different currents by a applying different read (or input) voltages to the memory cells is an operation resemblance with respect to the operation of neural synapses. Because the memory cells having different threshold voltages can be driven to provide different output currents by different read (input) voltages, threshold voltage of the memory cell can be set to be a weight value, such that each output signal from the synapses (i.e., memory cells) can be calculated by multiplying corresponding input voltage by related weight value. Subsequently, parallelly connecting the output currents of the memory cells to an identical node can be regarded as an artificial neuron connected with multi synapses. Consequently, an artificial neural network layer (also called fully connected layer) is therefore established by combining a plurality of artificial neurons.

A non-volatile memory device integrated with an artificial neural network layer have many practical and operational advantages listed as follows:

(1) Different threshold voltages of the memory cells in the non-volatile memory device provide corresponding weight or transconductance values so as to make the memory cells can be operated as the operation of neural synapses.

(2) After applying different input voltage to the memory cells having different threshold voltages, it is able to subsequently receiving and summing multi output currents from the memory cells. Apparently, summing the output currents of the memory cells at one circuit node can be regarded as an artificial neuron connected with multi synapses.

From above descriptions, it is understood that artificial neural network technology is suitable for being applying in non-volatile memory devices to enhance the accuracy of data verification of multi memory cells. Accordingly, inventors of the present application have made great efforts to make inventive research thereon and eventually provided a method of performing feedforward and recurrent operations in an artificial neural network using nonvolatile memory cells.

SUMMARY OF THE INVENTION

The primary objective of the present invention is to provide a method of performing feedforward and recurrent operations in an artificial neural network using nonvolatile memory cells. In the present invention, a plurality of nonvolatile memory cells or a memory array comprising the nonvolatile memory cells and necessary circuit units are integrated to an artificial neural network (ANN). Therefore, it is able to perform feedforward and recurrent operations in the M×N numbers of nonvolatile memory cells storing with different weights through the self-training learning function of the ANN.

In order to achieve the primary objective of the present invention, the inventor of the present invention provides one embodiment of the method of performing feedforward and recurrent operations in an artificial neural network using nonvolatile memory cells, comprising following steps:

(1) providing at least one artificial neural network in an nonvolatile memory device; wherein the artificial neural network is electrically connected to a controlling unit, and comprising: a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, a multiplexer electrically connected to the nonvolatile memory array, and a current-to-voltage conversion unit electrically connected to the multiplexer and the controlling unit; and wherein the nonvolatile memory array comprises M×N number of nonvolatile memory cells and the current-to-voltage conversion unit comprises N number of current-to-voltage converters;

(2) using the controlling unit to produce an input voltage set comprising M number of input voltages;

(3) the controlling unit applying a feedforward operation to the nonvolatile memory array through the decoder unit, the word line voltage regulating unit, and the bit line voltage regulating unit, so as to input the M number of input voltages to the M×N number of nonvolatile memory cells; wherein the M number of input voltages are different from each other;

(4) collecting the output currents from M number of nonvolatile memory cells lined up into one column of the nonvolatile memory array by using one of the N number of current-to-voltage converters, and the output currents being subsequently converted to corresponding output voltages by the current-to-voltage converters;

(5) repeating the steps (2)-(4) to make all of the output currents received from N columns of the nonvolatile memory array be converted to corresponding output voltages or all errors are within a predetermined range; and (6) determining whether there are other different input voltage sets comprising M number of input voltages generated by the controlling unit; if yes, proceeding to repeat the steps (2)-(5) until all of the input voltage sets are adopted for inputting the nonvolatile memory array.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a method of performing feedforward and recurrent operations in an artificial neural network using nonvolatile memory cells disclosed by the present invention, embodiments of the present invention will be described in detail with reference to the attached drawings hereinafter.

Figure 1:
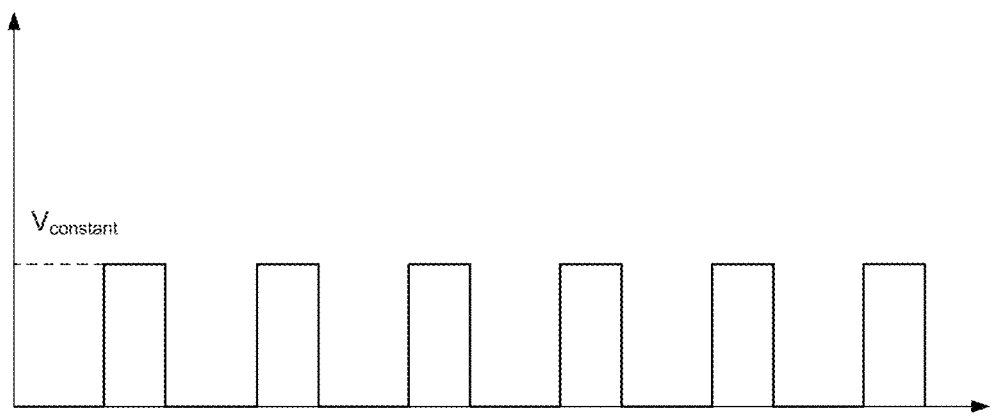
FIG. 1 shows a waveform diagram for depicting a data writing signal with periodic constant pulse voltages.
Figure 2:
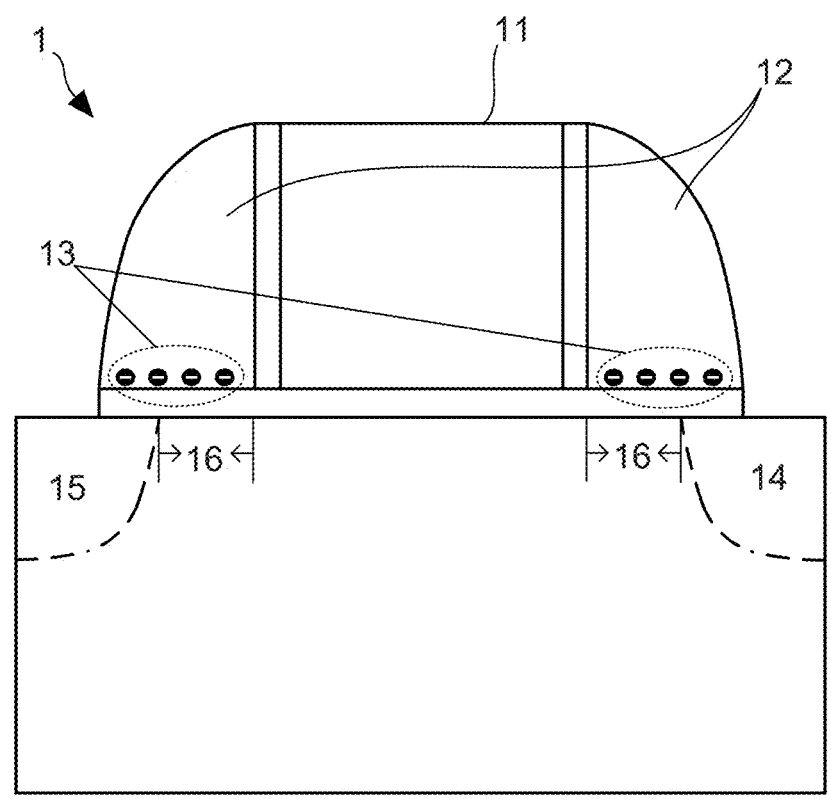
FIG. 2 shows a cross-sectional side view of a non-overlapped implementation (NOI) MOSFET.

With reference to FIG. 2, there is provided a cross-sectional side view of a non-overlapped implementation (NOI) MOSFET. NOI MOSFET 1 is a novel nonvolatile memory cell capable of being stored with data bit 13 in its two spacers 12 after finishing a data writing (programming) operation carried out by channel hot electron injection (CHEI). By respectively applying a first positive voltage and a second positive voltage to a gate terminal 11 and a drain terminal 14 (or source terminal 15) of the NOI MOSFET 1 as well as making the source terminal 15 (or drain terminal 14) to be grounded, electrons flowing out from the source terminal 15 (or drain terminal 14) would be converted to so-called "hot electrons" after being accelerated by electrical field in a channel under the Gate of the NOI MOSFET 1. As a result, the hot electrons moving in the channel inject into the spacer 12 of the NOI MOSFET 1 because of scattering with lattice phonons. On the other hand, the programmed bits (i.e., the injected electrons) in the spacers 12 can also be removed after completing a data erasing operation carried out by hot holes injection (HHI). By respectively applying a negative voltage and a positive voltage to the gate terminal 11 and the drain terminal 14 (or source terminal 15) of the NOI MOSFET 1 as well as making the source terminal 15 (or drain terminal 14) to be grounded, holes in the Drain diffusion (or Source diffusion) of the NOI MOSFET 1 become "hot holes" after getting specific energy. Consequently, the hot holes directly inject into the spacers from the Drain diffusion (or Source diffusion) of the NOI MOSFET 1.

In the present invention, the number (or amount) of the injected electrons in the spacer 12 is regarded as a bit weight. Moreover, a data bit adjusting operation can be applied to the NOI MOSFET 1 (i.e., nonvolatile memory cell) through completing the data writing operation or the data erasing operation by one or multi times. It is worth mentioning that, in the present invention, a nonvolatile memory array comprising M×N number of NOI MOSFETs 1 (i.e., nonvolatile memory cells) is particularly integrated in to a nonvolatile memory device comprising at least one artificial neural network. By such arrangement, it is able to easily perform data bit adjusting operations in the M×N number of NOI MOSFETs 1, so as to effectively adjust or correct the data bits stored in the spacers 12 of the M×N number of NOI MOSFETs 1 through a feedforward operation or a recurrent operation of the artificial neural network with nonvolatile memory cells.

Figure 3:
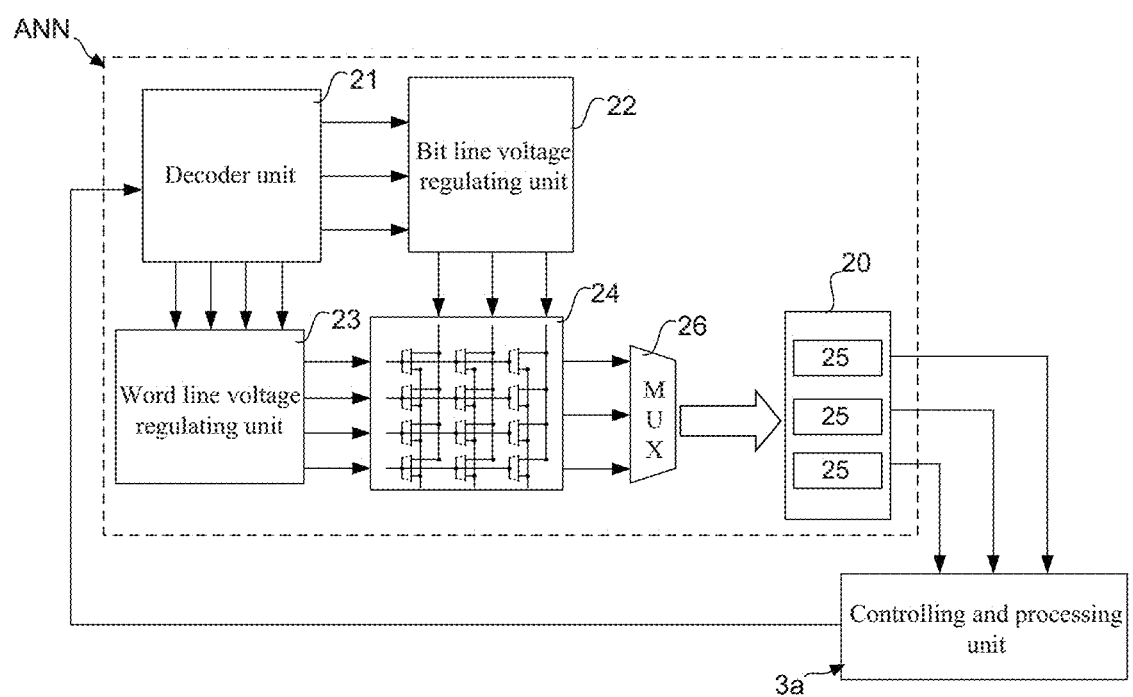
FIG. 3 shows a first circuit block diagram of a nonvolatile memory device having an artificial neural network therein.

Please refer to FIG. 3, which illustrates a circuit block diagram of a nonvolatile memory device having an artificial neural network therein. From FIG. 3, it is understood that the nonvolatile memory device comprises: a nonvolatile memory array 24, bit line voltage regulating unit 22, a word line voltage regulating unit 23, a decoder unit 21, and a current-to-voltage conversion unit 20. In which the bit line voltage regulating unit 22 is electrically connected to the decoder unit 21 and the nonvolatile memory array 24, and the word line voltage regulating unit 23 is also electrically connected to the decoder unit 21 and the nonvolatile memory array 24. Moreover, the nonvolatile memory array 24 is electrically connected to the current-to-voltage conversion unit 20 comprising N number of current-to-voltage converters 25. On the other hand, the decoder 21 and the current-to-voltage conversion unit 20 are simultaneously electrically connected to the controlling unit 3a.

It is worth explaining that, the said controlling unit 3a can be a microprocessor or a memory chip testing apparatus having host computer. Moreover, despite the fact that the NOI MOSFETs 1 are adopted for being as the M×N number of nonvolatile memory cells in the nonvolatile memory array 24, the nonvolatile memory cells for constituting the nonvolatile memory array 24 does not be limited to be the NOI MOSFETs 1. In practical use, the nonvolatile memory cells can also be floating gate memory cells, resistive random access memory (RRAM) cells, phase-change memory (PCM) cells, magnetoresistive random-access memory (MRAM) cells, or silicon-oxide-nitride-oxide-silicon (SONOS) memory cells.

Figure 4:
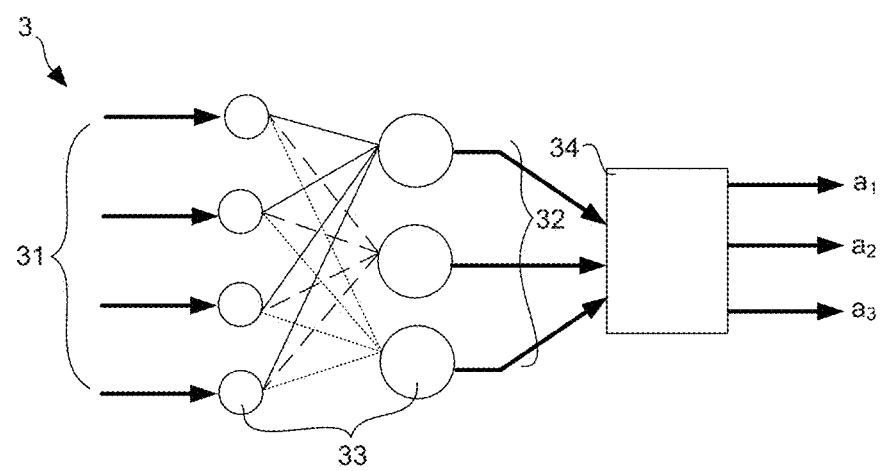
FIG. 4 shows a basic framework diagram of an artificial neural network.

Referring to FIG. 3 again, and please simultaneously refer to FIG. 4 showing a basic framework diagram of an artificial neural network. FIG. 4 depicts that the artificial neural network 3 comprises four input nodes 31, three output nodes 32 and three hidden nodes 33. After inputting data or signals to the three hidden nodes 33 via the four input nodes 31, a Net Input would be subsequently processed or converted by an active function or a mathematical algorithm, such that back-end device is able to received three outputs (a1, a2, a3) from the three output nodes 32. After comparing FIG. 3 with FIG. 4, it is able to find that, a first column of the nonvolatile memory array 24 comprising four nonvolatile memory cells, a second column of the nonvolatile memory array 24 comprising four of nonvolatile memory cells, and a third column of the nonvolatile memory array 24 comprising four nonvolatile memory cells can be regarded as three nerve neurons of an artificial neural network ANN. Obviously, each of the nerve neurons comprises four synapses since every row of the nonvolatile memory array 24 comprises four nonvolatile memory cells.

Figure 5:
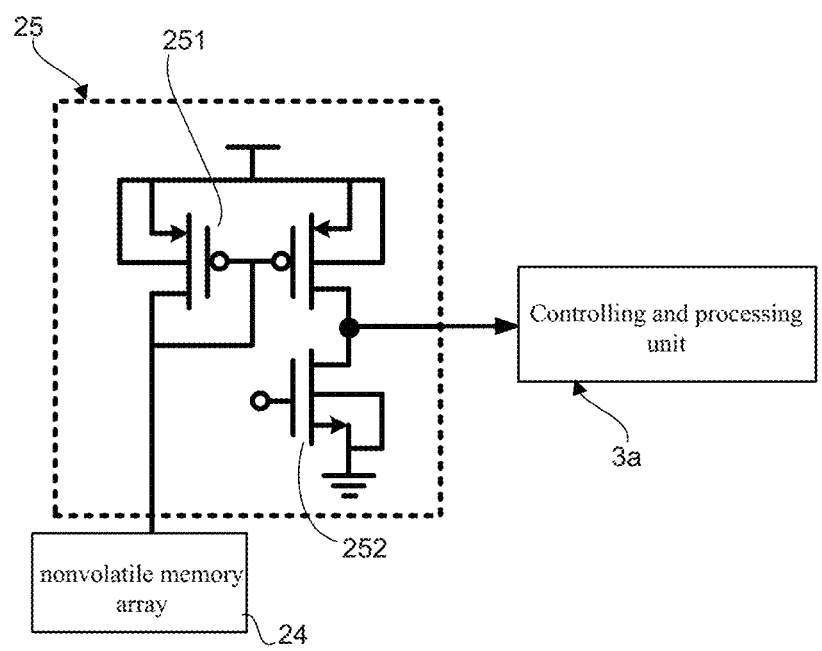
FIG. 5 shows a circuit topology diagram of a current-to-voltage converter.

Please continuously refer to FIG. 5, there is provided a circuit topology diagram of a current-to-voltage converter. In the present invention, the current-to-voltage converter 20 compress N number of current-to-voltage conversion units 25, and the current-to-voltage conversion unit 25 is composed of a current mirror 251 and a voltage-controlled resistor 252. Therefore, output currents of the artificial neuron flow into the corresponding current mirrors 251 after input voltages are applied to an artificial neuron (i.e., one column of the nonvolatile memory array comprising M number of nonvolatile memory cells). Subsequently, the output currents are converted to output voltages by the voltage-controlled resistor 252. As a result, the controlling unit 3a is able to verify output levels of the artificial neuron by comparing the output voltages with a reference voltage.

Figure 6A:
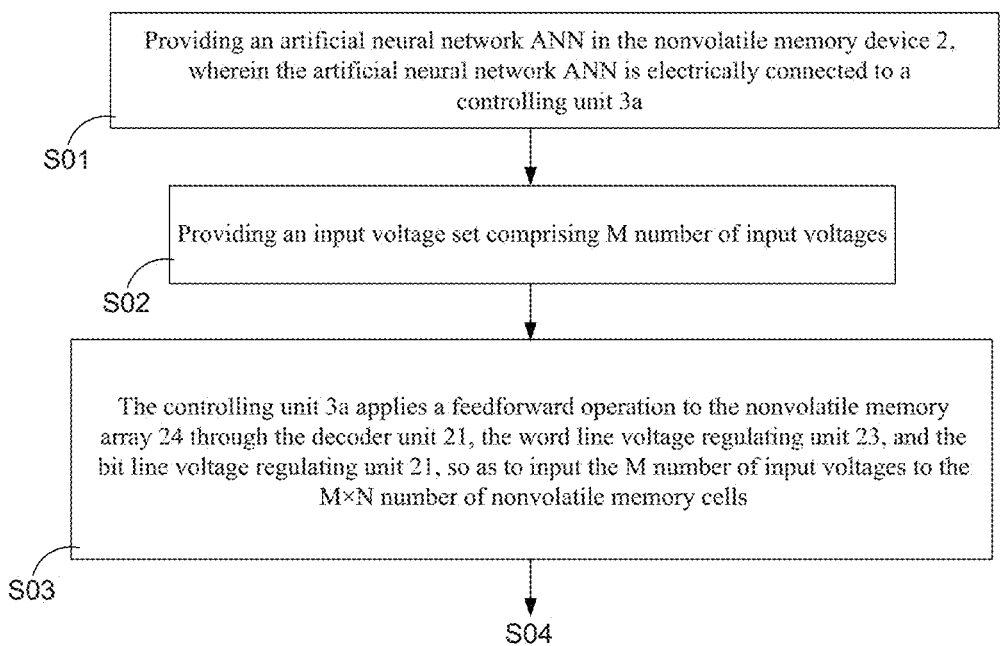
FIG. 6A and FIG. 6B show a flowchart diagram of a method of performing feedforward and recurrent operations in an artificial neural network using nonvolatile memory cells according to the present invention.
Figure 6B:
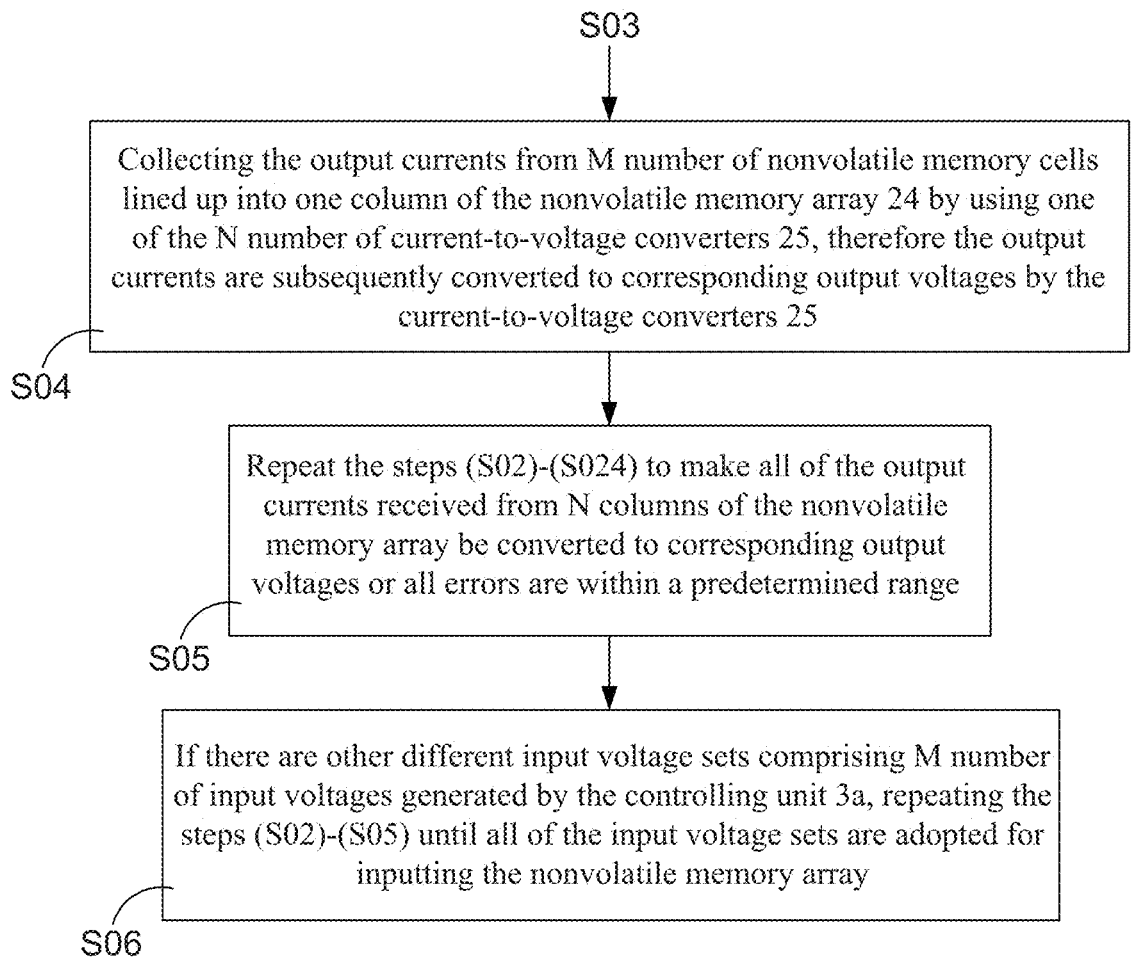

FIG. 6A and FIG. 6B show a flowchart diagram of a method of performing feedforward and recurrent operations in an artificial neural network using nonvolatile memory cells according to the present invention. As FIG. 3, FIG. 6A and FIG. 6B show, the present method mainly comprises 6 steps.

First of all, the method executes step (S01) to providing an artificial neural network ANN in the nonvolatile memory device 2, wherein the artificial neural network ANN is electrically connected to a controlling unit 3a and comprises: a decoder unit 21 electrically connected to the controlling unit 3a, a bit line voltage regulating unit 22 electrically connected to the decoder unit 21, a word line voltage regulating unit 23 electrically connected to the decoder unit 21, a nonvolatile memory array 24 electrically connected to the bit line voltage regulating unit 22 and the word line voltage regulating unit 23, a multiplexer 26 electrically connected to the nonvolatile memory array 24, and a current-to-voltage conversion unit 20 electrically connected to the multiplexer 26 and the controlling unit 3a. Moreover, FIG. 3 also indicates that the nonvolatile memory array 24 comprises M×N number of nonvolatile memory cells and the current-to-voltage conversion unit 20 comprises N number of current-to-voltage converters 25.

Figure 7:
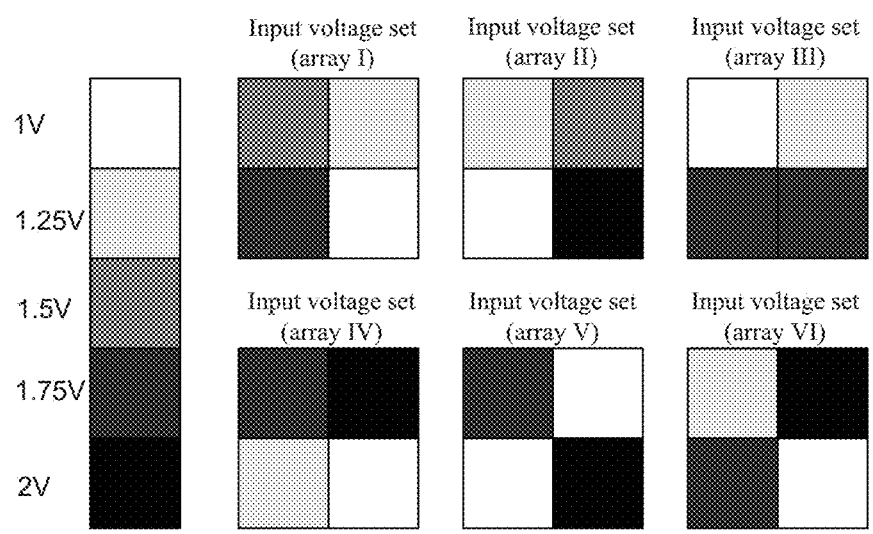
FIG. 7 shows a diagram for describing various input voltage sets comprising M number of input voltages.

Next, the method flow proceeds to step (S02) for making the controlling unit 3a to produce an input voltage set comprising M number of input voltages. FIG. 7 shows a diagram for describing various input voltage sets comprising M number of input voltages. Moreover, when the step (S03) is executed, the controlling unit 3a applies a feedforward operation to the nonvolatile memory array 24 through the decoder unit 21, the word line voltage regulating unit 23, and the bit line voltage regulating unit 21, so as to input the M number of input voltages to the M×N number of nonvolatile memory cells. In which, the M number of input voltages are different from each other. Moreover, it needs to explain that an output current $I_D$ provided by the nonvolatile memory cell (i.e., NOI MOSFET 1) can be calculated by using the mathematical equation of $$I_D = I_0 \cdot \left(1 - e^{\frac{-V_{DS}}{V_T}}\right) \cdot e^{\frac{V_{GS}}{mV_T}} \cdot e^{\frac{V_{th}}{mV_T}}.$$

In the mathematical equation, $I_0$ means an output current as $V_{GS}$ is equal to $V_{th}$ and m is a substrate parameter of the NOI MOSFET 1.

Please refer to FIG. 2 and FIG. 3 again. Data bits stored in memory cells (i.e., NOI MOSFETs 1) are formed by electrons injected into the spacers 12 of the NOI MOSFETs 1. In order to effectively verify the amount of the electrons, different input voltages are applied to the memory cells of the nonvolatile memory array 24 via the word line voltage regulating unit 23. As FIG. 7 shows, each input voltage set has a plurality of input voltages in a range between 1V and 2V. On the other hand, because the artificial neural network ANN comprises four word lines to connect the memory cells in the nonvolatile memory array 24, the input voltage set is particularly designed to a 2×2 array ($b_{ij}$) comprising four input voltages of ($b_{11}$), ($b_{12}$), ($b_{21}$), and ($b_{22}$). Therefore, The method flow next proceeds to step (S04) for collecting the output currents from M number of nonvolatile memory cells lined up into one column of the nonvolatile memory array 24 by using one of the N number of current-to-voltage converters 25, therefore the output currents are subsequently converted to corresponding output voltages by the current-to-voltage converters 25. Particularly, because the present method regards the amount of the electrons stored in the spacer 12 as a weight value, different input voltages are hence applied to the memory cells of the nonvolatile memory array 24 for collecting corresponding output currents for the verification of the amount of the electrons. For example, FIG. 7 describes that input voltage sets are particularly designed to 2×2 arrays I-VI, respectively, wherein each of the input voltage sets comprising four input voltages in a range from 1V to 2V. Because the memory cells may have different threshold voltages, the particularly-designed input voltage sets are adopted for driving the memory cells provide different output currents, such that each output signal (current) from the synapses (i.e., memory cells) can be calculated by multiplying corresponding input voltage by related weight value (i.e., threshold voltage). For this purpose, the present method subsequently proceeds step (S05), so as to repeat the steps (S02)-(S024) to make all of the output currents received from N columns of the nonvolatile memory array be converted to corresponding output voltages or all errors are within a predetermined range. Apparently, summing the output currents of the memory cells at one circuit node can be regarded as an artificial neuron connected with multi synapses. Next, step (S06) is executed to determining whether there are other different input voltage sets comprising M number of input voltages generated by the controlling unit 3a; if yes, method flow is subsequently proceeded to repeat the steps (S02)-(S05) until all of the input voltage sets are adopted for inputting the nonvolatile memory array.

Figure 8:
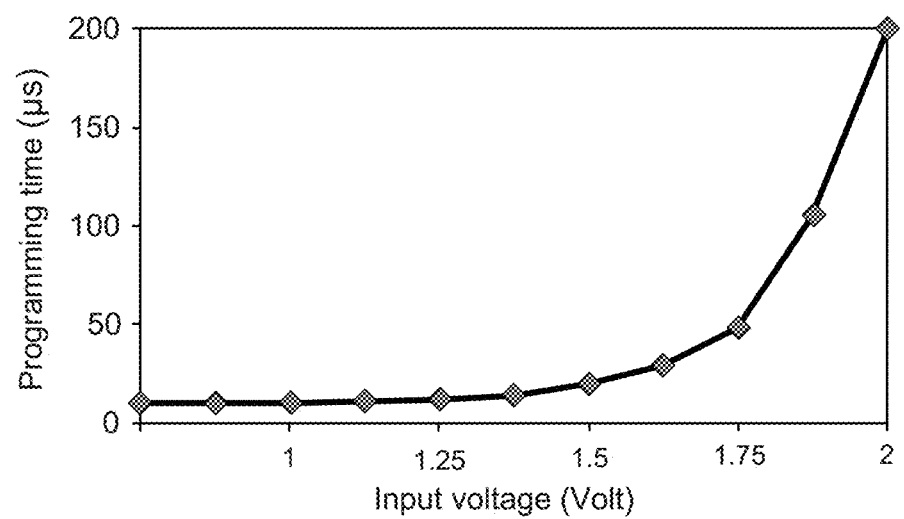
FIG. 8 shows a graphic plot of input voltage versus programming time.

Please continuously refer to FIG. 8, which illustrates a graphic plot of input voltage versus programming time. It needs to further explain that the above-described steps (S02)-(S05) can be a data writing operation. For example, after one input voltage set comprising according M number of input voltages is generated or selected, controlling unit 3a would find M number of programming times according to the M number of input voltages by looking up the graphic plot of FIG. 8. As FIG. 2 shows, the memory cell (i.e., NOI MOSFET 1) is able to store with data bit 13 in its spacer 12 after finishing the data writing (programming) operation carried out by channel hot electron injection (CHEI) or Fowler-Nordheim tunneling. By the use of decoder unit 21, bit line voltage regulating unit 22 and word line voltage regulating unit 23, a first positive voltage and a second positive voltage can be applied to the gate terminal 11 and the drain terminal 14 (or source terminal 15) of the NOI MOSFET 1 in the case of grounding the source terminal 15 (or drain terminal 14), such that electrons flowing out from the source terminal 15 (or drain terminal 14) would be converted to so-called "hot electrons" after being accelerated by electrical field in a channel under the Gate of the NOI MOSFET 1. As a result, the hot electrons moving in the channel inject into the spacer 12 of the NOI MOSFET 1 because of scattering with lattice phonons.

On the contrary, the above-described steps (S02)-(S05) can also be a data erasing operation. When the data erasing operation is adopted for completing the bit adjustment of the memory cells, each the nonvolatile memory cell (i.e., NOI MOSFET 1) is capable of being erased with data bit 13 from its spacer 12 after finishing the data erasing operation carried out by band-to-band tunneling induced hot carrier injection (BBHC) or Fowler-Nordheim tunneling. Through the use of decoder unit 21, bit line voltage regulating unit 22 and word line voltage regulating unit 23, a negative voltage and a positive voltage can be applied to the gate terminal 11 and the drain terminal 14 (or source terminal 15) of the NOI MOSFET 1 in the condition of grounding the source terminal 15 (or drain terminal 14), therefore holes in the Drain diffusion (or Source diffusion) of the NOI MOSFET 1 become "hot holes" after getting specific energy. Consequently, the hot holes directly inject into the spacers from the Drain diffusion (or Source diffusion) of the NOI MOSFET 1.

Figure 9:
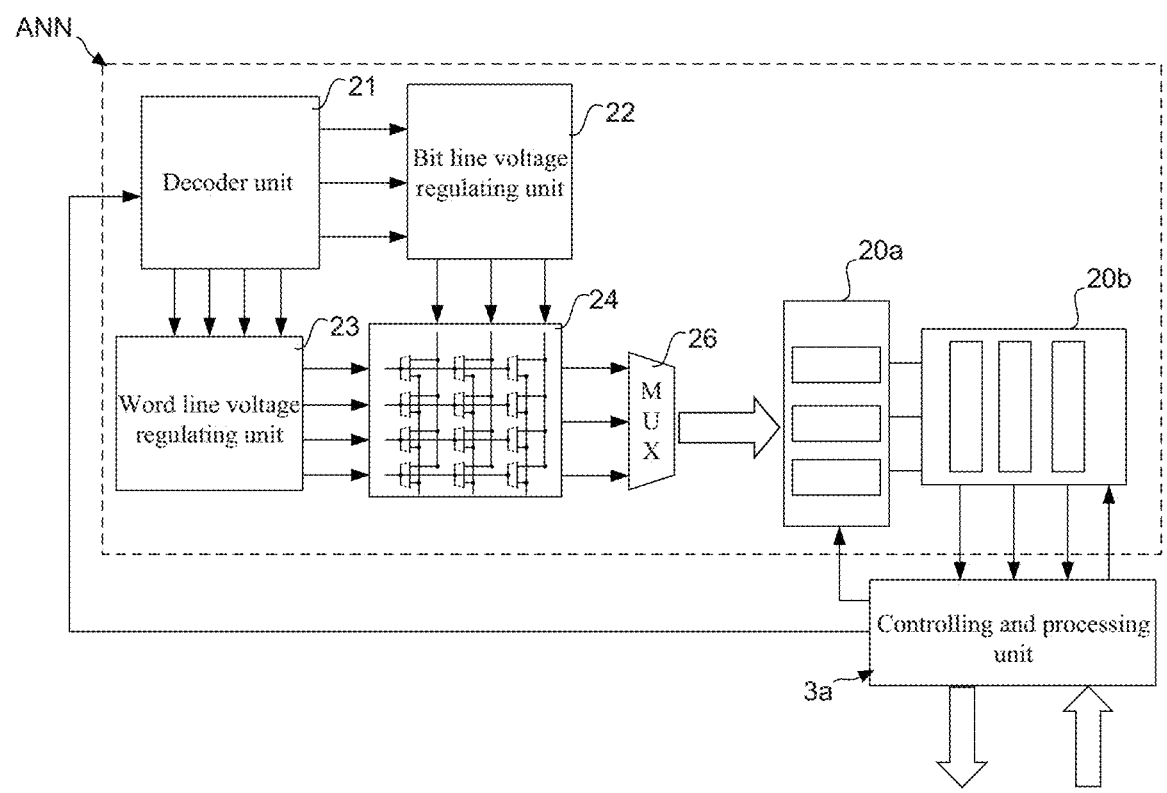
FIG. 9 shows a second circuit block diagram of the nonvolatile memory device having the artificial neural network therein.

FIG. 9 shows a second circuit block diagram of the nonvolatile memory device having the artificial neural network therein. After comparing FIG. 9 with FIG. 3, it is found that the second framework of the nonvolatile memory device has a plurality of function operators 20a and a plurality of output registers 20b instead of the current-to-voltage converters 25 used in the above-described first framework. In the case of that the method described by FIG. 6A and FIG. 6B is implemented into the second framework of the nonvolatile memory device, at least one input voltage would be temporarily stored in the output registers 20b after an input voltage set comprising M number of input voltages is generated or selected during the execution of step (S02). Moreover, in the execution of step (S06), if there are other different input voltage sets comprising M number of input voltages generated, the controlling unit 3a would be configured to adopt one input voltage set after a delay time passes, such that the method flow is able to subsequently proceed to repeat the steps (2)-(5) until all of the input voltage sets are adopted for inputting the nonvolatile memory array 24.

Therefore, through above descriptions, the method of performing feedforward and recurrent operations in an artificial neural network (ANN) using nonvolatile memory cells proposed by the present invention have been introduced completely and clearly; in summary, the present invention includes the advantages of:

(1) In the present invention, a plurality of nonvolatile memory cells or a memory array consists of the nonvolatile memory cells and necessary circuit units are integrated to form an artificial neural network (ANN). Therefore, it is able to perform feedforward and recurrent operations in the M×N numbers of nonvolatile memory cells storing with different weights through the self-training learning function of the ANN.

The above description is made on embodiments of the present invention. However, the embodiments are not intended to limit scope of the present invention, and all equivalent implementations or alterations within the spirit of the present invention still fall within the scope of the present invention.

What is claimed is:

1. A method of performing feedforward and recurrent operations in an artificial neural network using nonvolatile memory cells, comprising following steps:
  (1) providing at least one artificial neural network with an nonvolatile memory device; wherein the artificial neural network is electrically connected to a controlling unit, and comprising: a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, a multiplexer electrically connected to the nonvolatile memory array, and a current-to-voltage conversion unit electrically connected to the multiplexer and the controlling unit; and wherein the nonvolatile memory array comprises M×N number of nonvolatile memory cells and the current-to-voltage conversion unit comprises a plurality of current-to-voltage converters;
  (2) using the controlling unit to produce an input voltage set comprising M number of input voltages;
  (3) the controlling unit performing a feedforward operation to the nonvolatile memory array through the decoder unit, the word line voltage regulating unit, and the bit line voltage regulating unit, so as to input the M number of input voltages to the M×N number of nonvolatile memory cells;
  (4) the controlling unit performing a recurrent operation to collect the output currents from M number of nonvolatile memory cells lined up in one column of the nonvolatile memory array by using at least one of the N number of current-to-voltage converters, and the output currents being subsequently converted to corresponding output voltages through the controlling unit and the current-to-voltage converters;
  (5) repeating the steps (2)-(4) to make all of the output currents received from N columns of the nonvolatile memory array be converted to corresponding output voltages or reach a predetermined number of iterations; and (6) determining whether there are other different input voltage sets; if yes, proceeding to repeat the steps (2)-(5) until all of the input voltage sets are applied to the nonvolatile memory array.

2. The method of claim 1, wherein the nonvolatile memory cell is selected from the group consisting of non-overlapped implementation (NOI) MOSFET, floating gate memory cell, resistive random access memory (RRAM) cell, phase-change memory (PCM) cell, magnetoresistive random-access memory (MRAM) cell, and nitride-trapping memory cell.

3. The method of claim 1, further comprising a step for completing a data writing operation, wherein the data writing operation comprises following steps:

(P1) applying at least one programming signal to the nonvolatile memory cells needing to be executed by a data adjusting operation for a predetermined programming time through the decoder unit, the bit line voltage regulating unit and the word line voltage regulating unit;

Wherein the programming signals perform a channel hot carrier injection (CHEI) or a Fowler-Nordheim tunneling in the nonvolatile memory cell.

4. The method of claim 1, further comprising a step for completing a data erasing operation, wherein the data erasing operation comprises following steps:

(E1) the controlling unit applying at least one erasing signal to the nonvolatile memory cells needing to be executed by a data adjusting operation for a predetermined erasing time through the decoder unit, the bit line voltage regulating unit and the word line voltage regulating unit;

wherein the bit erasing signals perform a band-to-band tunneling induced hot carrier injection or a Fowler-Nordheim tunneling in the nonvolatile memory cell.

5. The method of claim 3, wherein the data adjusting operation is applied to one single nonvolatile memory cell or multiple nonvolatile memory cells in the nonvolatile memory array.

6. A method of performing feedforward and recurrent operations in a nonvolatile memory device using nonvolatile memory cells, comprising following steps:

(1) providing at least one artificial neural network in the nonvolatile memory device;

wherein the artificial neural network is electrically connected to a controlling unit, and comprising: a decoder unit electrically connected to the controlling unit, a bit line voltage regulating unit electrically connected to the decoder unit, a word line voltage regulating unit electrically connected to the decoder unit, a nonvolatile memory array electrically connected to the bit line voltage regulating unit and the word line voltage regulating unit, a multiplexer electrically connected to the nonvolatile memory array, a plurality of function operators electrically connected to the multiplexer and the controlling unit, a plurality of output registers electrically connected to the function operators and the controlling unit; and wherein the nonvolatile memory array comprises M×N number of nonvolatile memory cells;

(2) using the controlling unit to produce an input voltage set comprising M number of input voltages;

(3) the controlling unit performing a feedforward operation to the nonvolatile memory array through the decoder unit, the word line voltage regulating unit, and the bit line voltage regulating unit, so as to input the M number of input voltages to the M×N number of nonvolatile memory cells;

(4) the controlling unit performing a recurrent operation to produce output signals from the function operators based on collected output currents from M number of nonvolatile memory cells lined up in one column of the nonvolatile memory array through the multiplexer and signals from the output registers wherein at least one of the output signal of the function operators being temporarily stored in the output registers after the recurrent operation;

(5) repeating the steps (2)-(4) to make all of the output currents received from N columns of the nonvolatile memory array be converted to corresponding output signals from the function operators or reach a predetermined number of iterations; and (6) determining whether there are other different input voltage sets; if yes, selecting one input voltage set after a delay time passes, and subsequently proceeding to repeat the steps (2)-(5) until all of the input voltage sets are applied to the nonvolatile memory array.

7. The method of claim 6, wherein the nonvolatile memory cell is selected from the group consisting of non-overlapped implementation (NOI) MOSFET, floating gate memory cell, resistive random access memory (RRAM) cell, phase-change memory (PCM) cell, magnetoresistive random-access memory (MRAM) cell, and nitride-trapping (SONOS) memory cell.

8. The method of claim 6, further comprising a step for completing a data writing operation, wherein the data writing operation comprises following steps:

(P1) applying at least one programming signal to the nonvolatile memory cells needing to be executed by a data adjusting operation for a predetermined programming time through the decoder unit, the bit line voltage regulating unit and the word line voltage regulating unit;

Wherein the programming signal performs a channel hot carrier injection (CHEI) or a Fowler-Nordheim tunneling in the nonvolatile memory cell.

9. The method of claim 6, further comprising a step for completing a data erasing operation, wherein the data erasing operation comprises following steps:

(E1) the controlling unit applying at least one erasing signal to the nonvolatile memory cells needing to be executed by a data adjusting operation for a predetermined erasing time through the decoder unit, the bit line voltage regulating unit and the word line voltage regulating unit;

wherein the erasing signal performs a band-to-band tunneling induced hot carrier injection or a Fowler-Nordheim tunneling in the nonvolatile memory cell.

10. The method of claim 8, wherein the data adjusting operation is applied to one single nonvolatile memory cell or multiple nonvolatile memory cells in the nonvolatile memory array.

* * * * *